United States Patent [19]  [11] 3,979,688
Maidique  [45] Sept. 7, 1976

[54] TRANSISTOR AMPLIFIER OF THE DARLINGTON TYPE WITH INTERNAL BIAS PROVIDING LOW OFFSET VOLTAGE AND OFFSET CURRENT DRIFT

[75] Inventor: Modesto A. Maidique, Lexington, Mass.

[73] Assignee: Analog Devices, Inc., Norwood, Mass.

[22] Filed: Oct. 6, 1975

[21] Appl. No.: 619,600

Related U.S. Application Data

[63] Continuation of Ser. No. 470,213, May 15, 1974, abandoned.

[52] U.S. Cl. .............................. 330/30 D; 330/32; 330/38 M; 330/40
[51] Int. Cl.[2] ......................................... H03F 3/45
[58] Field of Search .......... 330/22, 40, 30 D, 38 M, 330/32; 307/315, 303, 299 B; 357/46

[56] References Cited
UNITED STATES PATENTS

| | | | |
|---|---|---|---|
| 3,573,645 | 4/1971 | Wheatley | 330/22 X |
| 3,673,508 | 6/1972 | Callahan | 330/30 D |
| 3,689,752 | 9/1972 | Gilbert | 307/229 |

*Primary Examiner*—James B. Mullins
*Attorney, Agent, or Firm*—Parmelee, Johnson & Bollinger

[57] ABSTRACT

A transistor amplifier of the Darlington type, in which successive transistors have their collectors connected in common and in which the emitter of the first transistor is connected to the base of the second transistor, is characterized by a source of bias current for the first transistor which tends to suppress variations in transistor current gain and which permits the Darlington amplifier to operate in differential configurations with low offset voltage drift and low offset current drift. The bias current source is arranged to direct between the emitter of the first transistor and the emitter of the second transistor a bias current which is a predetermined fraction, e.g., one-tenth, of the collector current of the second transistor, thereby stabilizing the operation of the first transistor. The bias current source is formed in one case by a second collector region arranged in the second transistor with a size selected to provide the predetermined fraction of collector current and connected to the emitter of the first transistor. In another case, the bias current source is formed by a third transistor having its emitter and base connected in common with the emitter and base of the second transistor and having its collector connected to the emitter of the first transistor, the third transistor having its size selected in relation to the size of the second transistor to carry the predetermined fraction of the collector current of the second transistor.

12 Claims, 8 Drawing Figures

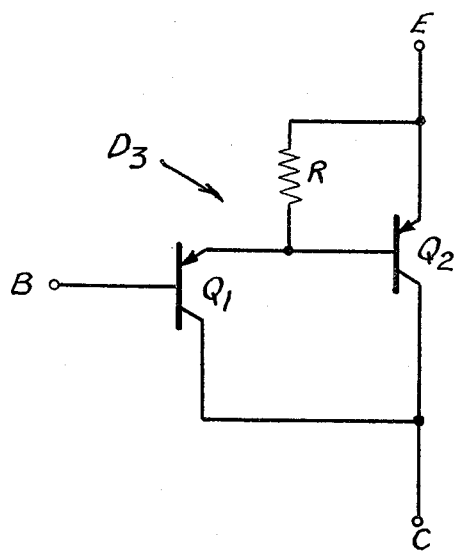
Fig. 3.
PRIOR ART
Fig. 4.
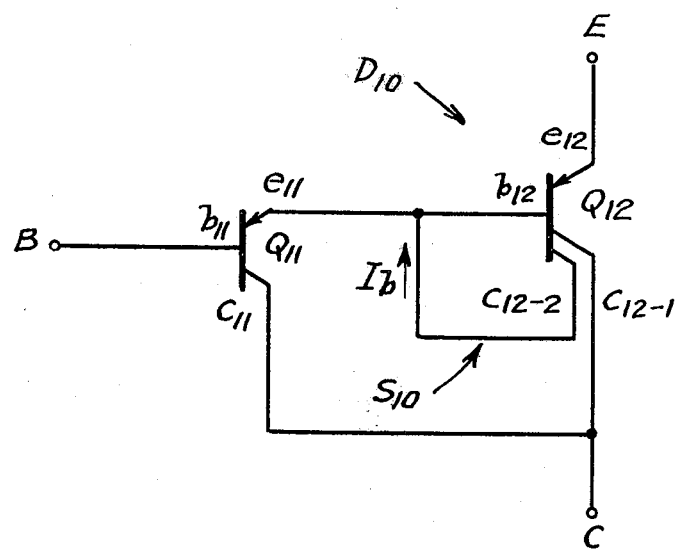
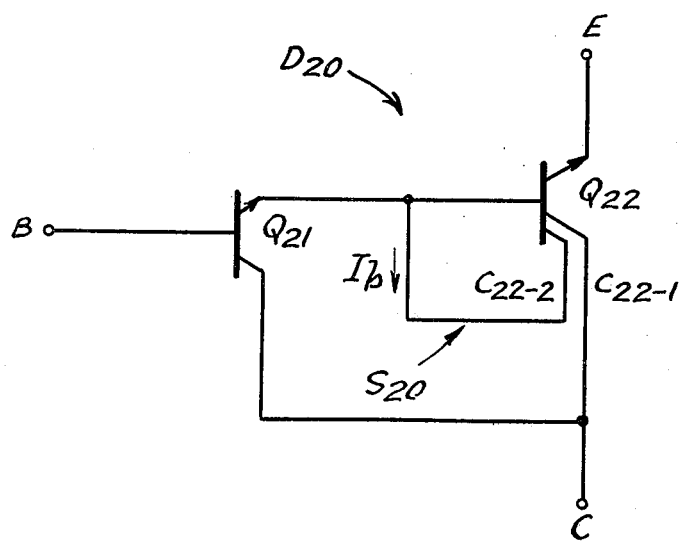
Fig. 5.

TRANSISTOR AMPLIFIER OF THE DARLINGTON TYPE WITH INTERNAL BIAS PROVIDING LOW OFFSET VOLTAGE AND OFFSET CURRENT DRIFT

CROSS REFERENCE TO RELATED APPLICATION

This application is a continuation of application Ser. No. 470,213, filed May 15, 1974, and abandoned upon the filing hereof.

BACKGROUND OF THE INVENTION

1. Field of the Invention

This invention relates to transistor amplifiers of the Darlington type, and to means for producing bias current therein so as to improve the operating characteristics of such amplifiers, particularly when used in differential configurations in integrated circuits.

In many types of differential amplifiers such as prior art differential amplifier A illustrated in FIG. 1, it is desirable to load a differential input stage I with an active load L1, that is, a load formed by the output impedance of two transistors Q1 and Q2 operated at constant current. An acitve load provides a higher dynamic impedance than could be obtained with a resistor operating at the same current and with the same supply voltage limitations. This higher impedance results in a large first-stage gain, which is desirable for several commonly recognized reasons.

FIG. 1 illustrates the basic configuration of a PNP active load L1. A common-mode loop or other means such as voltage source V is provided to apply a bias voltage to the bases of PNP transistors Q1 and Q2. This voltage causes voltage to be developed across resistors R1 and R2. Assuming R1 = R2 and that the base-emitter voltages V$be$1 and V$be$2 of Q1 and Q2 are equal, the emitter currents of the two transistors will be forced to be equal. As a result, if $\beta$, the common base current transfer ratio, is the same in both transistors, the collector currents $ic_1$ and $ic_2$ will be equal. This equality of collector currents is essential since the collector currents determine the operating currents of the two NPN halves Qa and Qb of the input stage I, and this current ratio strongly influences the input offset voltage of the differential amplifier D at its inputs a, b.

If the two base-emitter voltages V$be$1 and V$be$2 do not ideally match, this effect can be suppressed by increasing the voltage drop across R1 and R2. Therefore, there are means at hand to reduce errors resulting from Vbe mismatch to arbitrarily small values. If the base currents $ib_1$ and $ib_2$ do not match, unequal base currents are subtracted from emitter currents which are forced to be equal. As a result, the collector currents will differ by the amount of base current difference. Increasing the transistor current multiplication factor $\beta$ (or $\alpha$) has the effect of diminishing the absolute magnitude of the base currents, and, hopefully, their resulting difference. However, integrated circuit process technology limits the $\beta$ below values which give satisfactory base current differences.

Efforts to provide a satisfactorily high $\beta$ may take the form shown in FIG. 2, which illustrates an active load L2 with transistors Q3 and Q4 added to form two Darlington amplifiers D1 and D2.

Transistor amplifiers of the Darlington type are characterized by a construction in which successive cascaded transistors, connected to form a three terminal device, have an overall current multiplication factor $\beta$ essentially equal to the product of the current multiplication factors of the individual transistors. The successive transistors Q1–Q3 and Q2–Q4 are connected, as shown, e.g., in Darlington U.S. Pat. No. 2,663,806, with the two collectors in common and the emitter of the first transistor connected to the base of the second transistor.

Transistor amplifiers of the Darlington type are advantageous because of their very high current gain and because, as three terminal devices, they can be substituted for single transistors.

As a result in active load L2 the Darlington amplifiers formed by composite transistors Q1–Q3 and Q2–Q4 have very high effective gains $\beta$ 13 and $\beta$ 24 which essentially are the products $\beta$ 1 $\beta$ 3 and $\beta$ 2 $\beta$ 4. This will reduce the base currents substantially. The difference between $\beta$ 13 and $\beta$ 24 may, of course, be larger than the difference in the configuration of FIG. 1, so that the improvement may be less than anticipated. This results because integrated circuit techniques are capable of matching current gain in separate transistors on the same chip only to within about 20%. Since the base currents of Q1 and Q2 are assumed to be unequal, the operating currents of Q3 and Q4 will differ. As a result any difference in their $\beta$'s will be exaggerated. Moreover, the different operating currents will cause a Vbe mismatch which aggravates the problem of forcing equal emitter currents, particularly since V$be$ varies thermally. An additional disadvantage is that the low bias level in Q3 and Q4 results in poor frequency response and dynamic performance.

2. Description of the Prior Art

Various biasing arrangements have been proposed to alleviate the foregoing problems of the Darlington amplifier. One such arrangement, illustrated in FIG. 2, includes two current sources $i_3$ and $i_4$ (shown in dotted lines). These currents bias Q3 and Q4 at equal levels, to improve $\beta$ match and Vbe match, and at a current level which provides satisfactory dynamic performance. The disadvantage of this circuit is the difficulty of designing the current sources for $i_3$ and $i_4$. Since most of these currents appear in the active load output, they must be very well matched. Now the problem of matching the original simple active load has been transformed into a problem of matching $i_3$ to $i_4$. The matching requirement is less severe, but the complexity involved is high, since $i_3$ and $i_4$ themselves may require a circuit as complex as the circuit shown in FIG. 1, if temperature and operating point problems are to be avoided.

In another such arrangement, illustrated in FIG. 3, a Darlington amplifier D3 has a resistor R connected between the emitter of first transistor Q1 and the emitter of second transistor Q2 to bias the first transistor Q1 at a current level determined by the base-emitter voltage V$be$2 of the second transistor Q2 divided by the resistance R. Because integrated circuit techniques provide very good matches between base-emitter voltages V$be$, the first transistor Q1 on each side of the differential pair of Darlington amplifiers will have its collector current level biased uniformly instead of varying as the inverse of the $\beta$ of the second transistor Q2. This arrangement has not been fully satisfactory, however, because the stability of the bias point of the first transistor Q1 still fluctuates at about 0.5% per degree centigrade along with the thermal fluctuation in Vbe. The fluctuation in bias point is transmitted directly to the offset current which thus is excessively temperature sensitive.

SUMMARY OF THE INVENTION

It is a principal object of this invention to provide improved transistor amplifiers of the Darlington type. It is a specific object of the invention to provide a Darlington amplifier which is minimally affected by β mismatch to provide low offset voltage drift and low offset current drift in differential circuits. Still another object of the invention is to provide a Darlington type amplifier which is more suitable for integrated circuit construction and commercial use.

In a preferred embodiment of the invention to be described hereinbelow in detail, the Darlington amplifier is characterized by a bias current producing means arranged to direct between the emitter of the first transistor and the emitter of the second transistor a bias current which is a predetermined fraction, e.g. one tenth, of the collector current of the second transistor. The bias current is supplied by transistor means arranged, e.g., by an appropriate ratio between collector areas, to develop a collector current which is said predetermined fraction of the collector current of the second transistor. In one embodiment, the transistor means is formed together with the second transistor as a double collector transistor with its base and emitter portions coinciding respectively with the base and emitter of the second transistor, and in another embodiment, the transistor means is a third transistor with a discrete base, collector and emitter connected with its emitter and base in common with the emitter and base of the second transistor and its collector connected to the emitter of the first transistor. This arrangement suppresses β mismatch and affords low offset voltage drift and low offset current drift in differential configurations while maintaining the three-terminal advantages of the Darlington structure. The arrangement further is advantageous in that it applies to both NPN and PNP constructions, and in that it is compatible with various integrated circuit construction techniques and tends to solve problems those techniques introduce.

Other objects, aspects and advantages of the invention will be pointed out in, or apparent from, the detailed description hereinbelow, considered together with the following drawings.

DESCRIPTION OF THE DRAWINGS

FIG. 3 is an illustration of a prior art biasing technique for a Darlington amplifier;

FIGS. 4 through 7 are diagramatic illustrations of different forms of the improved Darlington transistor amplifier according to the present invention.

DESCRIPTION OF THE PREFERRED EMBODIMENT

Figure 1:
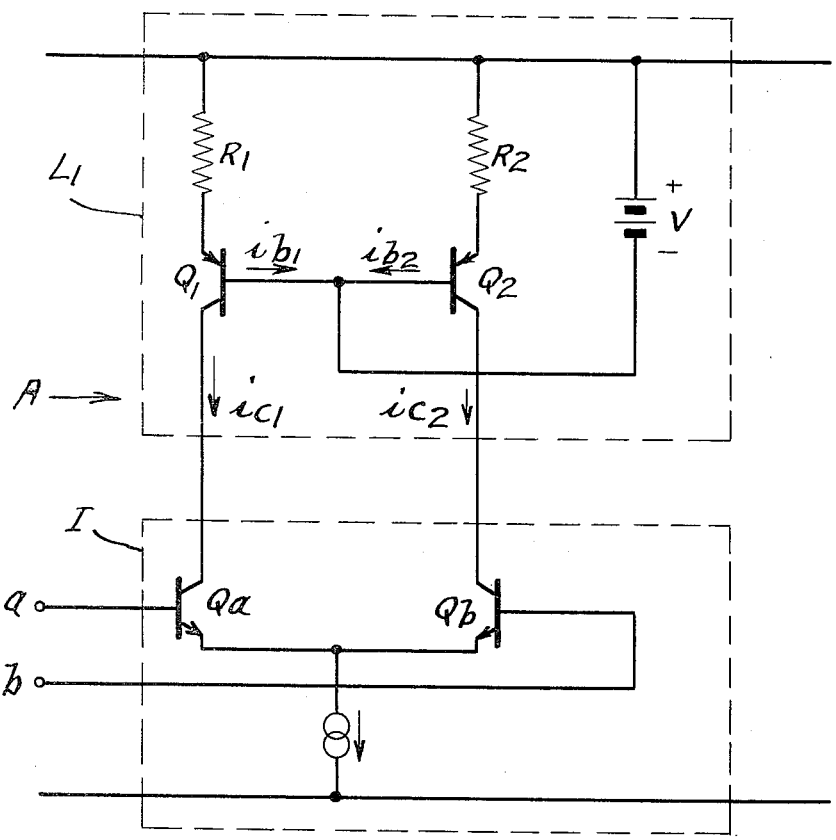
FIG. 1 is a diagramatic illustration of a prior art differential amplifier employing an active load.
Figure 2:
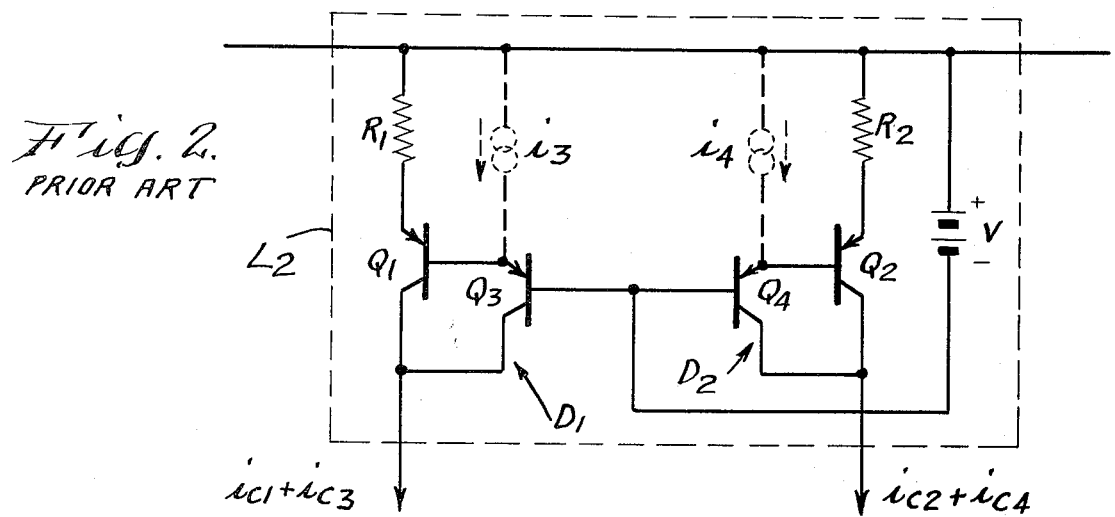
FIG. 2 is an illustration of another prior art active load.

FIG. 4 illustrates a Darlington transistor amplifier D10 which is constructed according to the present invention. The Darlington amplifier D10 comprises PNP transistors Q11 and Q12 arranged in customary Darlington configuration, with the emitter $e11$ of transistor Q11 connected to base $b12$ of transistor Q12, and with the collector $c11$ of Q11 connected to the primary collector $c12$-1 of double collector integrated circuit transistor Q12. External terminals B, C and E of amplifier D10 are formed respectively by the base $b11$ of transistor Q11, the joined collectors $c11$ and $c12$-1, and the emitter $e12$ of transistor Q12.

As indicated previously, the conventional Darlington circuit does not provide sufficient operating point or temperature stability. In order to improve the characteristics of Darlington type amplifiers, the present invention provides a bias current source indicated generally as S10 and arranged to bias transistor Q11 with a bias current $Ib$ which is a predetermined fraction of the collector current of transistor Q12. In the embodiment shown in FIG. 4, bias current source S10 is formed by a portion of double collector transistor Q12, which has its second collector C12-2 connected to the emitter $e11$ of transistor Q11, and which acts, in effect, as two separate transistors having coinciding emitters and bases. A large collector area ratio $n$ is provided between the separate collectors $c12$-1 and $c12$-2 so that the current $Ib$ in the collector C12-2 of Q3 is $1/n$ of the total current flowing through the primary collector of transistor Q12. Accordingly a precise fraction $1/n$ of the current in Q12 flows to emitter $e11$ and this current $Ib$ serves as a source of well behaved bias for Q11 which tends to mask β mismatches and which is insensitive to variations in Vbc with temperature.

Selection of the ratio $n$ is governed by several considerations. Generally, $n$ is selected to be small in relation to the β of Q12 so that the current flowing through the emitter of Q11 will be determined principally by the bias current $Ib$ and only to a minor extent by the β of transistor Q12, which is subject to mismatching. For example, if the β of Q12 were 50, an appropriate value for $n$ is 10, which reduces the effect of fluctuation by a factor of 5. Optimally, the ratio $n$ is determined by an error analysis of the circuit, taking into account the expected range of variations in β and other parameters which are to be expected with the construction techniques used. The influence of each parameter variation on offset voltage and current drift is calculated, and n is chosen to provide the lowest root-mean-square error. It is apparent, therefore, that the best value of n depends not only upon β and its expected variation, but also upon construction techniques and other considerations.

For conventional construction techniques in the integrated circuit field, where as explained before β fluctuation is on the order of 20%, typical values of $n$ are approximately 5 to 15 where PNP transistors are used.

The present invention is also applicable to Darlington transistor amplifiers D20 using NPN transistors Q21 and Q22 as illustrated in FIG. 5. The bias current source S20 in this instance is provided by a second collector C22-2 of double collector transistor Q22, connected to the emitter of transistor Q21, and having an area of $1/n$ of the area of primary collector C22-1 so that bias current $Ib$ diverted from the emitter of Q21 is $1/n$ of the current flowing from transistor Q22 to terminal C.

Slightly different parameter variations may be encountered in constructing NPN transistors, and hence the best value of n may differ somewhat.

Present integrated circuit technology forms NPN transistors vertically in the substrate and double collector NPN transistors tend not to be practically feasible. Accordingly, when the Darlington amplifier is to be of the NPN type, it is preferable to form the bias current source with a separate transistor as will be described below with reference to FIG. 7. Present integrated circuit technology forms PNP transistors as lateral transistors, however, and double collector PNP transistors are thus easily formed. Where Darlington amplifiers are to be of the PNP type, therefore, the circuit arrangement shown in FIG. 4 is preferred.

It should be noted that the present invention, when applied to integrated circuit technology, is not only easier to provide, but also provides the greatest advantages in the PNP case. Typically, integrated circuit PNP transistors have $\beta$'s which are much lower than those available in the NPN case, and hence there exists a greater need for the high gains available from the Darlington configuration, and a greater need for the bias arrangement of the present invention which enables the Darlington configuration to be used without introducing excessive offset voltage and current drift.

Figure 6:
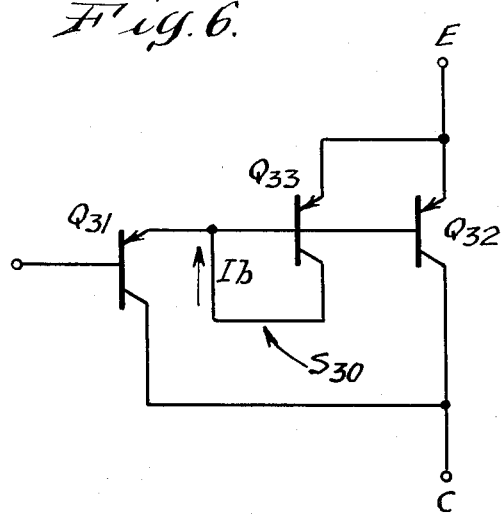
Figure 7:
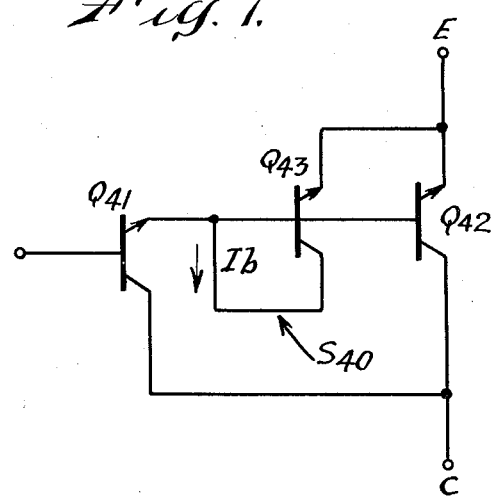

FIGS. 6 and 7 illustrate further Darlington transistor amplifiers D30 and D40 constructed in accordance with the present invention. Amplifiers D30 and D40, instead of using double collector transistors Q12 and Q22, employ separate transistors Q33 and Q43 to form bias current sources S30 and S40 respectively.

Referring to FIG. 6, illustrating the PNP case, transistor Q33 has its base connected to the emitter of the first transistor Q31, its emitter connected to the emitter of second transistor Q32, and its collector connected to its own base, and hence to the emitter of the first transistor Q31. Transistor Q33 has its collector area selected to be $1/n$ of the area of the collector of transistor Q32, so that the collector current Ib of transistor Q33, supplied as bias current to the emitter of Q31, is $1/n$ of the collector current of transistor Q32, thereby minimizing $\beta$ mismatch.

In FIG. 7, illustrating the preferred construction for the NPN case, transistor Q43 is connected in the same fashion as transistor Q33 to divert a bias current Ib, selected to be $1/n$ of the collector current of Q42, from the emitter of Q41 to the emitter of Q42.

Figure 8:
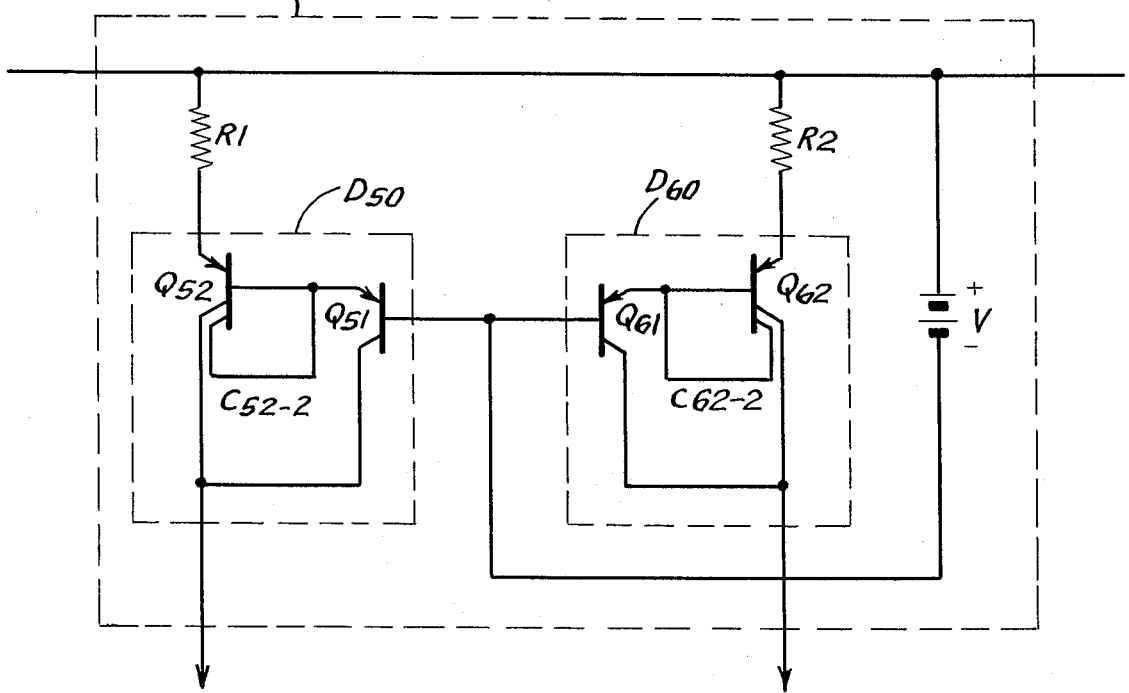
FIG. 8 is an illustration of an active load employing Darlington transistor amplifiers according to the present invention.

An active load L3 incorporating Darlington amplifiers D50 and D60 constructed according to the present invention is illustrated in FIG. 8. Amplifiers D50 and D60 are identical with amplifier D10 shown in FIG. 4, i.e., having lateral PNP transistors with a portion of their collector regions physically separated from the remainder to form second collector regions c-52-2 and c62-2. The current in these regions is diverted into the emitters of Q51 and Q61 as shown.

This controlled $\beta$ connection of the present invention adds a predetermined fraction of the collector current to the base current. This results in an apparent $\beta$ for each Darlington amplifier D50 and D60 which varies only a small amount, despite large changes in intrinsic PNP $\beta$ due to process variations. In this way a relatively invariant fraction of the emitter currents of Q52 and Q62 is diverted into the emitters of Q51 and Q61 respectively. A small mismatch in these currents will result in a small Vbe and base current mismatch in Q51 and Q61, but will not otherwise contribute to overall mismatch in the output. Since the fraction of the collector current diverted for bias is nearly all returned to join the remainder at terminal C, and both sides of the circuit work this way, little direct output mismatch results from slight mismatch in control collector current.

Although specific embodiments of the invention have been disclosed herein in detail, it is to be understood that this is for the purpose of illustrating the invention, and should not be construed as necessarily limiting the scope of the invention, since it is apparent that many changes can be made to the disclosed structures by those skilled in the art to suit particular applications.

I claim:

1. In a transistor amplifier of the Darlington type in which two successive transistors are connected with their collectors in common and with the emitter of the first transistor supplying current to the base of the second transistor to thereby form a three terminal device in which a first terminal provides a connection to apply an input signal to the base of the first transistor, and in which a second terminal at the common connection of the collectors of said transistors and a third terminal at the emitter of the second transistor provide connections to apply the output current of the device, the improvement which comprises:

transistor means having base and emitter portions connected in common with the base and emitter of the second transistor, and having a collector portion connected to the emitter of the first transistor to direct through the first transistor a bias current which is a predetermined fraction of the collector current of the second transistor, and the input impedance between the first and third terminals of the device being that presented by the base-to-emitter impedance of the first transistor operated at the bias current level determined by said transistor means, in series with the impedance presented between the emitter of the first transistor and the third terminal;

whereby the three terminal device will present a substantial input impedance to a signal source connected to said first terminal to avoid loading the source and to minimize the amount of current needed to drive the device, and at the same time will provide a highly predictable relationship between input voltage at said first terminal and output current through said second and third terminals.

2. A transistor amplifier of the Darlington type as claimed in claim 1 wherein said transistor means is a third transistor having base, collector and emitter portions separate from the base, collector and emitter of the second transistor.

3. A transistor amplifier of the Darlington type as claimed in claim 1 wherein the transistor means and the second transistor together form a double collector transistor with the base and emitter portions of the transistor means coinciding respectively with the base and emitter of the second transistor, and with the collector portion of the transistor means being formed as a separate collector connected to the emitter of the first transistor.

4. A transistor amplifier of the Darlington type as claimed in claim 3 wherein the double collector transistor forming the transistor means and the second transistor is a lateral PNP integrated circuit transistor.

5. A transistor amplifier of the Darlington type as claimed in claim 1 wherein said transistor means and said second transistor have a ratio of collector areas corresponding to said predetermined fraction.

6. A transistor amplifier of the Darlington type as claimed in claim 1 wherein the predetermined fraction of the collector current of the second transistor which is produced by the current producing means is less than one half.

7. A transistor amplifier of the Darlington type as claimed in claim 6 wherein said predetermined fraction is within the range of approximately one eighth to one fifteenth.

8. A transistor amplifier of the Darlington type as claimed in claim 1 wherein said predetermined fraction is related to the current gain of the first transistor such that the inverse of the fraction lies within the range of approximately one third to one tenth of the value of the current gain of the first transistor.

9. In an active load for a differential pair arrangement wherein the active load comprises two matched Darlington-type amplifiers, each having two successive transistors connected with their collectors in common and with the emitter of the first transistor connected to the base of the second transistor to thereby form a three terminal device in which a first terminal provides a connection to apply a signal to the base of the first transistor, and in which a second terminal at the common connection of the collectors of said transistors and a third terminal at the emitter of the second transistor provide connections to apply the output current of the device to the differential pair arrangement, the improvement which comprises:

in each of the two Darlington-type devices, a transistor means having emitter and base portions in common with the emitter and base of the second transistor, and having a collector portion connected to the emitter of the first transistor to direct through the first transistor a bias current which is a predetermined fraction of the collector current of the second transistor, the two transistor means in the two Darlington-type devices being matched to provide the same bias currents, the impedance between the first and third terminals of each of the two Darlington-type devices being that presented by the base-to-emitter impedance of the first transistor operated at the bias current level determined by said transistor means, in series with the impedance presented between the emitter of the first transistor and the third terminal, and a constant voltage source connected to the first terminals of each of the two Darlington-type devices, whereby each of the three terminal devices will present a substantial impedance to the voltage source connected to said first terminals to avoid loading the source and to minimize the amount of current needed to drive the devices, and at the same time will provide a highly predictable relationship between the input voltage at said first terminals and the output currents applied through said second and third terminals to the differential pair arrangement.

10. An active load for a differential pair arrangement as claimed in claim 9 wherein, in each Darlington-type device, the transistor means and the second transistor together form a double collector integrated circuit PNP transistor with the base and emitter portions of the transistor means coinciding respectively with the base and emitter of the second transistor, and with the collector portion of the transistor means being formed as a separate collector connected to the emitter of the first transistor.

11. An active load for a differential pair arrangement as claimed in claim 9 wherein said predetermined fraction of the collector current of the second transistor which is produced by the transistor means is within the range of approximately one-eighth to one-fifteenth.

12. An active load for a differential pair arrangement as claimed in claim 9 wherein said predetermined fraction is related to the current gain of the first transistor such that the inverse of the fraction lies within the range of approximately one-third to one-tenth of the value of the current gain of the first transistor.

* * * * *